United States Patent
Bibilashvili et al.

(10) Patent No.: US 7,566,897 B2
(45) Date of Patent: Jul. 28, 2009

(54) QUANTUM INTERFERENCE DEVICE

(75) Inventors: Amiran Bibilashvili, Tbilisi (GE); Avto Tavkhelidze, Tbilisi (GE)

(73) Assignee: Borealis Technical Limited (GI)

( * ) Notice: Subject to any disclaimer, the term of this patent is extended or adjusted under 35 U.S.C. 154(b) by 0 days.

(21) Appl. No.: 11/901,549

(22) Filed: Sep. 18, 2007

(65) Prior Publication Data

US 2008/0067561 A1    Mar. 20, 2008

(30) Foreign Application Priority Data

Sep. 18, 2006   (GB) ................... 0618268.7

(51) Int. Cl.
   *H01L 29/06* (2006.01)
(52) U.S. Cl. ........................... 257/9; 257/24
(58) Field of Classification Search .......... 257/9, 257/24
   See application file for complete search history.

(56) References Cited

U.S. PATENT DOCUMENTS

| | | | |
|---|---|---|---|
| 3,740,592 A | 6/1973 | Engdahl et al. | |
| 4,011,582 A | 3/1977 | Cline et al. | |
| 4,039,352 A | 8/1977 | Marinescu | |
| 4,063,965 A | 12/1977 | Cline et al. | |
| 4,686,162 A | 8/1987 | Stangl et al. | |
| 5,023,671 A | 6/1991 | DiVincenzo et al. | |
| 5,068,535 A | 11/1991 | Rabalais | |
| 5,119,151 A | 6/1992 | Onda | |
| 5,130,766 A * | 7/1992 | Arimoto et al. | 257/192 |
| 5,204,588 A | 4/1993 | Ugajin et al. | |
| 5,229,320 A | 7/1993 | Ugajin | |
| 5,233,205 A | 8/1993 | Usagawa et al. | |
| 5,247,223 A | 9/1993 | Mori et al. | |
| 5,332,952 A | 7/1994 | Ugajin et al. | |
| 5,336,547 A | 8/1994 | Kawakita et al. | |
| 5,371,388 A | 12/1994 | Oda | |
| 5,432,362 A | 7/1995 | Lippens et al. | |
| 5,497,015 A | 3/1996 | Ishibashi et al. | |
| 5,503,963 A | 4/1996 | Bifano | |
| 5,504,388 A | 4/1996 | Kimura et al. | |
| 5,519,232 A | 5/1996 | Park et al. | |
| 5,521,735 A | 5/1996 | Shimizu et al. | |
| 5,579,232 A | 11/1996 | Tong et al. | |
| 5,604,357 A | 2/1997 | Hori | |

(Continued)

FOREIGN PATENT DOCUMENTS

DE    3404137 A1    8/1985

(Continued)

OTHER PUBLICATIONS

Chou et al., "Imprint Lithography with 25 Namometer Resolution", Science, Apr. 5, 1996, pp. 85-87, vol. 272.

(Continued)

*Primary Examiner*—Douglas M Menz

(57) ABSTRACT

A quantum interference transistor comprising an source region for emitting electron waves into a vacuum, a drain region for collecting the electron waves, a repeating nanostructure in a region between the source and drain regions for introducing a constant phase shift between a plurality of electron waves, and a gate for controlling the phase shift introduced by the nanostructure; wherein the repeating nanostructure is characterized by having sharply defined geometric patterns or indents of a dimension that creates de Broglie wave interference.

18 Claims, 2 Drawing Sheets

U.S. PATENT DOCUMENTS

| | | | |
|---|---|---|---|
| 5,654,557 A | 8/1997 | Taneya et al. |
| 5,675,972 A | 10/1997 | Edelson |
| 5,699,668 A | 12/1997 | Cox |
| 5,705,321 A | 1/1998 | Brueck et al. |
| 5,719,407 A | 2/1998 | Ugajin |
| 5,722,242 A | 3/1998 | Edelson |
| 5,772,905 A | 6/1998 | Chou |
| 5,917,156 A | 6/1999 | Nobori et al. |
| 6,117,344 A | 9/2000 | Cox et al. |
| 6,214,651 B1 | 4/2001 | Cox |
| 6,225,205 B1 | 5/2001 | Kinoshita |
| 6,281,514 B1 | 8/2001 | Tavkhelidze |
| 6,309,580 B1 | 10/2001 | Chou |
| 6,417,060 B2 | 7/2002 | Tavkhelidze et al. |
| 6,495,843 B1 | 12/2002 | Tavkhelidze |
| 6,531,703 B1 | 3/2003 | Tavkhelidze |
| 6,680,214 B1 | 1/2004 | Tavkhelidze et al. |
| 6,908,861 B2 | 6/2005 | Sreenivasan et al. |
| 6,914,312 B2 | 7/2005 | Nishikawa et al. |
| 6,919,605 B2 | 7/2005 | Tigelaar |
| 6,919,608 B2 | 7/2005 | Gregg |
| 7,074,498 B2 | 7/2006 | Tavkhelidze et al. |
| 2001/0046749 A1 | 11/2001 | Tavkhelidze et al. |
| 2003/0068431 A1 | 4/2003 | Taliashvili et al. |
| 2003/0221608 A1 | 12/2003 | Mori |
| 2004/0174596 A1 | 9/2004 | Umeki |
| 2005/0145836 A1 | 7/2005 | Tavkhelidze et al. |

FOREIGN PATENT DOCUMENTS

| | | | |
|---|---|---|---|
| DE | 3818192 A1 | 12/1989 |
| EP | 0437654 A1 | 7/1991 |
| JP | 03155376 A | 7/1991 |
| JP | 4080964 A | 3/1992 |
| JP | 05226704 A | 9/1993 |
| WO | WO-1999/013562 A1 | 3/1999 |
| WO | WO-1999/064642 A1 | 12/1999 |
| WO | WO-2000/059047 A1 | 10/2000 |
| WO | WO-2002/047178 A2 | 6/2002 |
| WO | WO-2003/083177 A3 | 10/2003 |
| WO | WO-2006/055890 A2 | 5/2006 |

OTHER PUBLICATIONS

Hishinuma et al., "Refrigeration by combined tunneling and thermionic emmission in vacuum: Use of nanometer scale design", Appl Phys Lett, Apr. 23, 2001, pp. 2572-2574, vol. 78, No. 17.

Sungtaek Ju et al., "Study of interface effects in thermoelectric microfefrigerators", Journal of Applied Physics, Oct. 1, 2000, pp. 4135-4139, vol. 88, No. 7.

Leon N. Cooper, "Bound Electron Pairs in Degenerate Fermi Gas", Physical Review, Nov. 15, 1956, pp. 1189-1190, vol. 104, No. 4.

Bardeen et al., "Theory of Superconductivity", Physical Review, Dec. 1, 1957, pp. 1175-1204, vol. 108, No. 5.

Tavkhelidze et. al, "Observation of quantum interference effect in solids", Journal of Vacuum Science & Technology B: Microelectronics and Nanometer Structures, May 12, 2006.

Tavkhelidze et. al, "Observation of New Quantum Interference Effect in Solids", Vacuum Nanoelectronics Conference, 2005. IVNC 2005. Technical Digest of the 18th International.

Ford et al., "Gated, asymmetric rings as tunable electron interferometers", Surface Science, Apr. 2, 1990, pp. 307-311, vol. 229, Issues 1-3.

* cited by examiner

QUANTUM INTERFERENCE DEVICE

CROSS-REFERENCE TO RELATED APPLICATIONS

This application claims the benefit of U.K. Patent Application No. GB0618268.7, filed Sep. 18, 2006, said document incorporated herein in its entirety by reference.

BACKGROUND OF THE INVENTION

This invention relates to quantum interference transistors.

In quantum interference devices, the mean free path of the electrons is larger than the device, which means that most electrons pass the device without being scattered. The Aharonov-Bohm interferometer works by splitting an electron wave into two halves. After propagating a certain distance the two waves are made to rejoin. If everything is symmetric waves will be in phase and the electron will continue undisturbed. If, on the other hand, the length of the two branches is different, the waves may be in antiphase. In this case the electron will be reflected instead.

While it is impractical to change the physical length of the device, a magnetic or electrical field may cause a similar effect. This will instead change the phase velocity of the electron which also will cause the waves to have different phase when rejoined. Applying a perpendicular magnetic field to the device results in a phase shift of the electron wave, with the ability to cause constructive or destructive interference of the two waves upon rejoining. FIG. 1 depicts a typical prior art AB device in which a multichannel 10 is formed at positions near source 12 and drain 14 and bifurcates into two channels which together form a ring shape at a location between source 12 and drain 14. An electron that enters from source 12 into multichannel 10 is separated into an electron wave passing through path A and an electron wave passing through path B in the ring-shaped portion. By applying a magnetic field, in this case through the use of solenoid 16 perpendicular to the multichannel, so as to penetrate the ring-shaped portion of multichannel 10, the phase difference between the electron waves passing through paths A and B is controlled, and transistor action is displayed.

Similarly, the phase of the wave function depends upon the scalar electric potential. By constructing a situation where the electrostatic potential varies for two paths of a particle, Aharonov-Bohm interference phenomenon from the phase shift is observed. A typical AB device involves a ring geometry interrupted by tunnel barriers and a gate, with a bias voltage relating the potentials of the two halves of the ring. The phase of the electrons change because their wavelengths change as they pass under the gate electrode, the part of the device to which the electric field is applied. The time an electron needs to pass through the channel depends on its wavelength. Electrons from the two channels collect at the same point, and in the case where the phase difference is $2\pi$ they will interfere constructively and conductance of the whole device will be maximal. FIG. 2 depicts a standard prior art device whose principle of operation is fundamentally the same as that of the AB device of FIG. 1, differing in that multichannel 10 is rectangular in shape between source 12 and drain 14, and that the phase difference between the electron waves passing through paths A and B is controlled by voltage applied between a pair of gate electrodes 18 and 20 that are arranged adjacent to outside positions of the multichannel 10.

Another embodiment of a typical quantum interference transistor controlled by an electric field is depicted in FIG. 3, where electrons are emitted from emitter 12 into a vertical type multichannel 10 that bifurcates into two channels one under barrier layer 24 and another without barrier layer. The phase difference between electrons passing along path A and electrons passing along path B is controlled by a gate voltage applied through gate electrode 24 formed on path A, thereby allowing for the execution of transistor action.

Phase shift between two channels is $(k-k')\Delta L$ where k is the wave vector of the electron in the channel, k' is the wave vector in the region under the gate electrode and $\Delta L$ is the length of channel region under the gate electrode. k' is regulated by changing the gate voltage.

Ford and et al. (1990) made a ring with half circles of different length. Conditions of interference are $k\Delta L=2\pi n$, k is regulated by changing the gate voltage.

U.S. Pat. Nos. 5,204,588 and 5,332,952 disclose a device comprising a source, drain, and gate, characterized in that the gate electrode is a capacitor. This quantum interference device provides an advantage over prior art devices in that it can be operated at room temperature and can therefore be applied to simple purposes and is advantageous in cost.

U.S. Pat. No. 5,497,015 teaches a quantum interference device in which a multichannel is formed by a dirac-delta-doped layer. A semiconductor device is disclosed having a channel portion comprising a plurality of zigzag lines whose width is negligible in comparison with the line length, thereby confining phonons in the location of the zigzag lines, and causing electron interference by controlling the phase of electrons passing through the plurality of zigzag lines. This transistor too is suitable for operation at higher temperatures since coherence is held until a high temperature, occurring because the multichannel is formed by a periodically bent ultrafine line that the scattering of the electron waves by the phonons can be suppressed so that it becomes difficult for the phonons to exert influence at high as well as low temperatures.

U.S. Pat. No. 5,519,232 discloses a quantum interference device in which the gate has a periodic structure wherein the length varies in a periodic manner in a transverse direction. The phases of electrons passing along different electron paths are caused to interfere with each other by the gate, leading to either a minimization or maximization of the drain current.

U.S. Pat. No. 5,521,735 discloses a novel wave combining and/or branching device and Aharanov-Bohm-type quantum interference device that has no curved waveguide and instead utilizes double quantum well structures.

In WO03/083177, the use of electrodes having a modified shape and a method of etching a patterned indent onto the surface of a modified electrode, which increases the Fermi energy level inside the modified electrode, leading to a decrease in electron work function is disclosed. FIG. 4 shows the shape and dimensions of a modified electrode 66 having a thin metal film 68 on a substrate 62. Indent 64 has a width b and a depth Lx relative to the height of metal film 60. Film 68 comprises a metal whose surface should be as plane as possible as surface roughness leads to the scattering of de Broglie waves. Metal film 68 is given sharply defined geometric patterns or indent 64 of a dimension that creates a De Broglie wave interference pattern that leads to a decrease in the electron work function, thus facilitating the emissions of electrons from the surface and promoting the transfer of electrons across a potential barrier. The surface configuration of modified electrode 66 may resemble a corrugated pattern of squared-off, "u"-shaped ridges and/or valleys. Alternatively, the pattern may be a regular pattern of rectangular "plateaus" or "holes," where the pattern resembles a checkerboard. The walls of indent 64 should be substantially perpendicular to one another, and its edges should be substantially sharp. The surface configuration comprises a substantially plane slab of a material having on one surface one or more indents of a depth approximately 5 to 20 times a roughness of said surface and a width approximately 5 to 15 times said depth. The walls of the indents are substantially perpendicular to one another, and the edges of the indents are substantially sharp. Typically the depth of the indents is $\geq \lambda/2$, wherein $\lambda$ is the de Broglie wavelength, and the depth is greater than the surface roughness of the metal surface. Typically the width of the indents is $>>\lambda$, wherein $\lambda$ is the de Broglie wavelength. Typically the thickness of the slab is a multiple of the depth, preferably between 5 and 15 times said depth, and preferably in the range 15 to 75 nm.

BRIEF SUMMARY OF THE INVENTION

In accordance with the present invention, there is provided a quantum interference transistor utilizing the interference of electrons passing through a bifurcated channel wherein an indented structure in one portion of the channel introduces a constant phase shift in the phase of the electrons, and an electric field applied through a gate electrode situated on the second portion of the bifurcated channel is used to modify the phase shift introduced by the indented surface.

It is an object of the present invention to provide a quantum phase interference transistor capable of efficiently controlling an electron phase shift, thereby utilizing the variation of the interference pattern of electron waves caused by phase control as the variation of collector current.

It is a further object of the present invention to turn a normally open transistor to a normally closed one through the existence of a constant phase shift. This has application in integrated circuits due to the ease of such technology. No new materials or novel layout is necessary to generate the constant phase shift, with the exception of the indented surface introduced into a second portion of the bifurcated channel.

It is a further object of the present invention to provide a quantum interference transistor having high modulation efficiency.

A further advantage of the present invention is the ability to use less esoteric materials to fine tune an electron phase shift.

An even further advantage of the present invention is that it is suitable for use at higher as well as lower temperatures.

Further objects and advantages will become apparent from the following detailed description to be read in connection with the accompanying drawings.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

Figure 1:
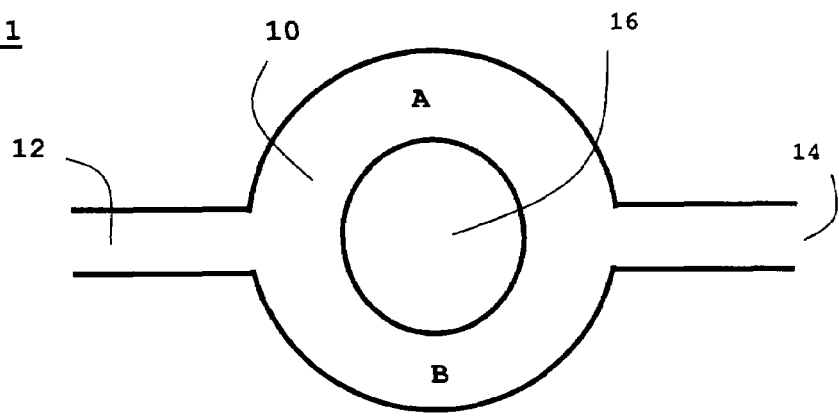
FIG. 1 shows a quantum interference device of the prior art in which interference is produced by a magnetic field.
Figure 2:
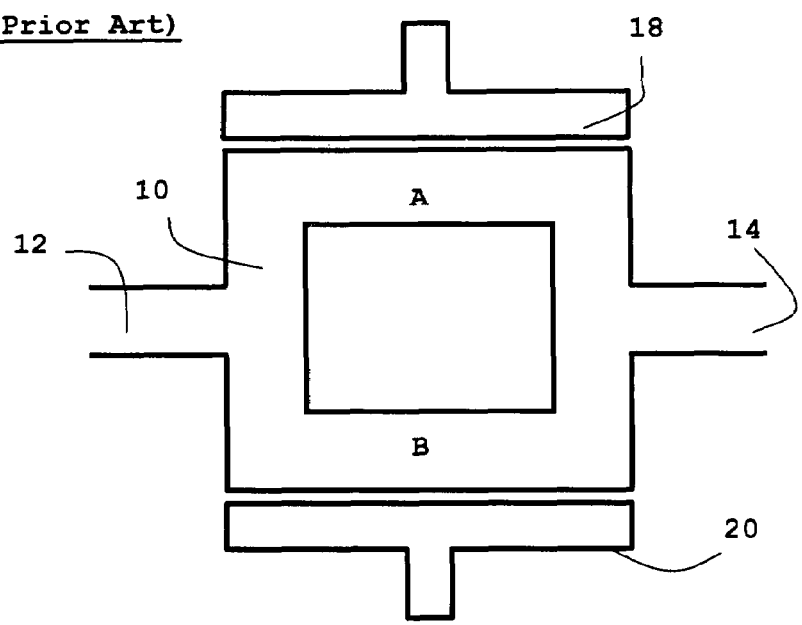
FIG. 2 shows a quantum interference device of the prior art in which interference is produced by an electric field.
Figure 3:
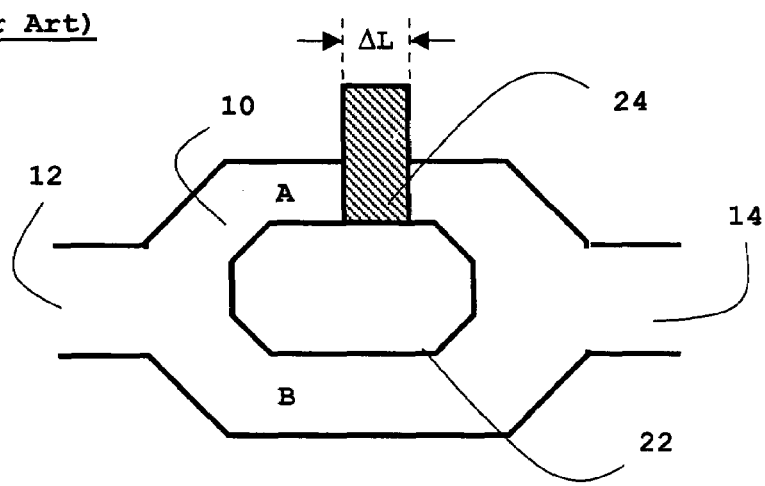
FIG. 3 shows a second quantum interference device of the prior art in which interference is produced by an electric field.
Figure 4:
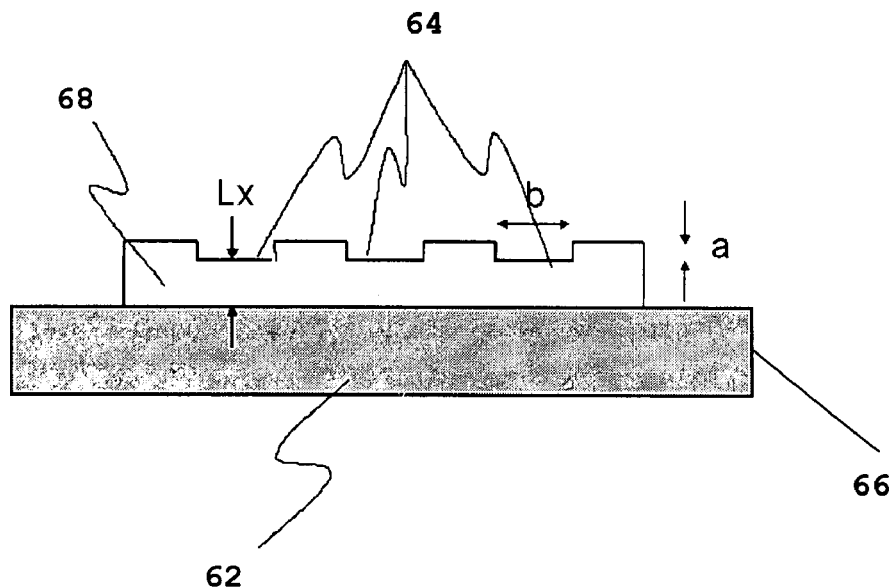
FIG. 4 shows a schematic of modified materials useful as gate or tunnelling barrier components.
Figure 5:
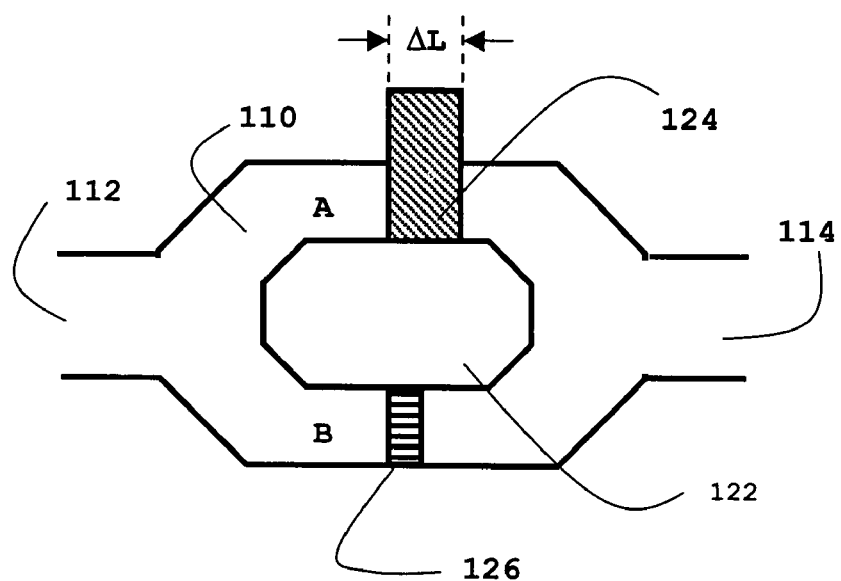
FIG. 5 shows a quantum interference device of this present invention in which one arm of the device has an indented surface.

Embodiments of the present invention and their technical advantages may be better understood by referring to FIG. 5, which shows a quantum interference device having a source region 112, a drain region 114, and a barrier region 122. Multichannel 110 divides into channels A and B of substantially the same length, which are in contact with the source and the drain regions. Channel A is of typical material and of a topology commonly used in these devices and well-known to those of ordinary skill in the art. Channel B has the indented surface depicted in FIG. 4. A gate electrode 124 is formed over channel A. The shape of the multichannel, depicted as octagonal in FIG. 5, is meant for illustrative purposes only, and other shapes where the channels A and B are of substantially the same length, including circular and rectangular, are likewise included in the scope of this invention.

The introduction of the indented surface depicted in FIG. 4 in channel B of multichannel 110 adds a constant phase shift in phase of the electron traveling along channel B. Existence of that constant phase shift turns a normally open transistor to normally closed one. The electric field introduced through gate electrode 124 to electrons passing through channel A is utilized to eliminate the effect of the indented surface 126, canceling out the phase shift introduced by the indented surface 126, thereby allowing the current to be switched on and off.

The surface configuration indented surface 126 may resemble a corrugated pattern of squared-off, "u"-shaped ridges and/or valleys. Alternatively, the pattern may be a regular pattern of rectangular "plateaus" or "holes," where the pattern resembles a checkerboard. The walls of indent 64 should be substantially perpendicular to one another, and its edges should be substantially sharp. The surface configuration comprises a substantially plane slab of a material having on one surface one or more indents of a depth approximately 5 to 20 times a roughness of said surface and a width approximately 5 to 15 times said depth. The walls of the indents are substantially perpendicular to one another, and the edges of the indents are substantially sharp. Typically the depth of the indents is $\geq \lambda/4$, wherein $\lambda$ is the de Broglie wavelength, and the depth is greater than the surface roughness of the metal surface. Typically the width of the indents is $>>\lambda$, wherein $\lambda$ is the de Broglie wavelength. Typically the thickness of the slab is a multiple of the depth, preferably between 5 and 15 times said depth, and preferably in the range 15 to 75 nm.

It is preferred that the substantially plane slab of material having indents is a metal, preferably an oxidation resistant metal, that is substantially homogeneous and free of granular irregularities. The metal optimally is a member of the group consisting of: lead, tin, and gold. In a further preferred embodiment, the material is a single crystal.

Although the present invention has thus far been described as utilizing a gate electrode to introduce an electric field to interact with the effects of the indented surface etched into one channel of the present device, in a further preferred embodiment of the present invention a magnetic field may be applied to achieve the same result of modifying the phase shifting effect of the indented surface to create transistor action.

While having described a specific preferred embodiment of the present invention with reference to the accompanied drawings, it is to be understood that the invention is not limited to that precise embodiment and that various changes ad modifications may be effected therein by one skilled in the art without departing from the scope of spirit of the invention as defined in the appended claims.

The invention claimed is:

1. A quantum interference transistor comprising;
   (a) a source region for emitting electrons;
   (b) a drain region for collecting electrons;
   (c) a bifurcated channel wherein a first portion of said channel is characterized by having an indented surface comprising a substantially plane slab of a material having on one surface one or more indents of a depth approximately 5 to 20 times a roughness of said surface and a width approximately 5 to 15 times said depth;
   (d) a field applied to a second portion of said channel to modify a constant phase shift introduced by said indented surface.

2. The device of claim 1, wherein said field is an electric field.

3. The device of claim 1, wherein said field is a magnetic field.

4. The indented surface of claim 1, wherein walls of said indents are substantially perpendicular to one another.

5. The indented surface of claim 1, in which edges of said indents are substantially sharp.

6. The indented surface of claim 1, in which the Fermi energy level of electrons is increased compared to a material comprising a substantially plane slab of the same metal not having on one surface one or more indents.

7. The material of claim 1 wherein said metal comprises an oxidation-resistant metal.

8. The material of claim 1 wherein said metal is substantially homogenous.

9. The material of claim 1 wherein said metal is selected from the group consisting of: lead, tin and gold.

10. The material of claim 1 wherein said metal is substantially free of granular irregularities.

11. The material of claim 1 wherein said metal is a single crystal.

12. The indented surface of claim 1, wherein said depth $\geq \lambda/2$, wherein $\lambda$ is the de Broglie wavelength.

13. The indented surface of claim 1, wherein said depth is greater than the surface roughness of the metal surface.

14. The indented surface of claim 1, wherein said width $>> \lambda$, wherein $\lambda$ is the de Broglie wavelength.

15. The indented surface of claims 1 wherein a thickness of said slab is a multiple of said depth.

16. The indented surface of claims 1 wherein a thickness of said slab is not a multiple of said depth.

17. The indented surface of claims 1 wherein a thickness of said slab is between 5 and 15 times said depth.

18. The indented surface of claims 1 wherein a thickness of said slab is in the range 15 to 75 nm.

* * * * *